United States Patent [19]
Padmanaban et al.

[11] Patent Number: 5,738,972
[45] Date of Patent: Apr. 14, 1998

[54] RADIATION SENSITIVE COMPOSITION

[75] Inventors: Munirathna Padmanaban; Natsumi Suehiro; Yoshiaki Kinoshita; Satoru Funato; Seiya Masuda; Hiroshi Okazaki; Georg Pawlowski, all of Saitama, Japan

[73] Assignee: Hoechst Japan Limited, Tokyo, Japan

[21] Appl. No.: 864,375

[22] Filed: May 28, 1997

Related U.S. Application Data

[63] Continuation of Ser. No. 550,649, Oct. 31, 1995, abandoned.

[30] Foreign Application Priority Data

Nov. 2, 1994 [JP] Japan ................... 6-269579

[51] Int. Cl.$^6$ ................... G03F 7/039; G03F 7/38
[52] U.S. Cl. ............. 430/270.1; 430/170; 430/191; 430/192; 430/193; 430/271.1; 430/325; 430/326; 430/330; 430/905
[58] Field of Search ................ 430/270.1, 170, 430/191, 192, 193, 271.1, 325, 326, 330

[56] References Cited

U.S. PATENT DOCUMENTS

| | | |
|---|---|---|
| 5,340,682 | 8/1994 | Pawlowski et al. . |
| 5,342,727 | 8/1994 | Vicari et al. . |
| 5,364,734 | 11/1994 | Pawlowski et al. ........ 430/270.1 |
| 5,595,855 | 1/1997 | Padmanaban et al. ....... 430/270.1 |
| 5,629,134 | 5/1997 | Oikawa et al. ............ 430/326 |

FOREIGN PATENT DOCUMENTS

| | | |
|---|---|---|
| 0-307-751 | 3/1989 | European Pat. Off. . |
| 0-307-752 | 3/1989 | European Pat. Off. . |
| 0-611-998 A2 | 8/1994 | European Pat. Off. . |

OTHER PUBLICATIONS

Schlegel et al., "Determination of Acid Diffusion in Chemical Amplification Positive Deep–UV Resists", Japanese Journal of Applied Physics, vol. 30, No. 11B, Nov. 1991, pp. 3132–3137.

Maruzen Petrochemical Co., Ltd., Kobunshi, vol. 38, 571 (1989).

S.A. McDonald et al., "Airborne Chemical Contamination of a Chemically Amplified Resist", SPIE vol. 1466 Advances in Resist Technology and Processing VIII (1991), pp. 2–13.

F. M. Houlihan et al., "An Evaluation of Nitrobenzyl Ester Chemistry for Chemical Amplification Resists", SPIE vol. 920 Advances in Resist Technology and Processing V (1988), pp. 67–74.

Crivello, "Possibilities for Photoimaging Using Onium Salts", Polymer Engineering and Science, Mid–December, 1983, vol. 23, No. 17, pp. 953–956.

Ito et al., "Chemical Amplification in the Design of Dry Developing Resist Materials", Polymer Engineering and Science, Dec., 1983, vol. 23, No. 18, pp. 1012–1018.

Pawloski et al., "Chemical Amplification & Dissolution Inhibition: A Novel High Performance Positive Tone Deep UV Resist", Journal of Photopolymer Science and Technology vol. 5, No. 1 (1992), pp. 55–66.

Hattori et al., "Time Delay Effect on a Positive Deep UV Resist Using Partially Tetrahydropyranyl–protected Polyvinylphenol", Journal of Photopolymer Science and Technology, vol. 6, No. 4 (1993), pp. 497–504.

Ito et al., "Approach Toward Enviromental Stabilization of Chemical Amplification Resists", Journal of Photopolymer Science and Technology, vol. 6, No. 4 (1993), pp. 547–562.

Wilson, "Organic Resist Materials–Theory and Chemistry", 1983 American Chemical Society, pp. 89–159.

*Primary Examiner*—John S. Chu
*Attorney, Agent, or Firm*—Foley & Lardner

[57] ABSTRACT

A chemically amplified resist material comprising: a) a homopolymer or a copolymer of hydroxystyrene or hydroxystyrene partly protected by a group sensitive to an acid such as a tetrahydropyranyl or t-butoxycarbonyl group, b) a dissolution inhibitor such as poly(N,O-acetal) or phenol or bisphenol protected by a group cleavable with an acid, c) a photosensitive compound capable of generating an acid upon exposure, d) a base capable of degrading upon radiation to regulate the line width in a period between the exposure step and the processing steps after exposure, e) a low-molecular weight phenolic or polyphenolic compound having a structure represented by the following general formula or a mixture of the phenolic or polyphenolic compounds:

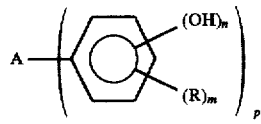

where n is an integer of 1 to 5, m is an integer of 0 to 4, n+m≦5, and p is an integer of 1 to 10, each R is a $C_1$-$C_{12}$ alkyl group or an unsubstituted or substituted cycloalkyl group or a $C_1$-$C_5$ hydroxyalkyl group, provided that hydrogen atoms may be substituted with a halogen atom and, when m is not less than 2, each R may be the same or different; A represents a hydrocarbon atomic grouping, having a valence of p, including an unsubstituted or substituted $C_1$-$C_{100}$ alicyclic, chain aliphatic, or aromatic hydrocarbon or a combination thereof with the carbon atoms being optionally substituted with an oxygen atom, provided that when p is 1, A may represent a hydrogen atom and, when p is 2, A may represent —S—, —SO—, —SO$_2$—, —O—, —CO—, or a direct bond, and f) a solvent for dissolving the components a) to e).

19 Claims, No Drawings

RADIATION SENSITIVE COMPOSITION

This application is a continuation of application Ser. No. 08/550,649, filed Oct. 31, 1995, now abandoned.

BACKGROUND OF THE INVENTION

1. Field of the Invention

The present invention relates to a radiation sensitive mixture suitable for the production of electronic components and printing plates.

2. Description of the Related Art

An ever-increasing tendency toward a reduction in structural dimension in the production of chips and the like has necessitated an improvement in a lithographic printing technique in a region of less than 1 μm. High energy UV light, electron beams, and X rays may be mentioned as exposure means used in such a technique. The improvement in the lithography has brought about a change in requirements which radiation sensitive compositions should meet. These requirements are summarized in, for example, C. G. Wilson, "Organic Resist Materials-Theory and Chemistry" [Introduction to Microlithography, Theory, Materials, and Processing, edited by L. F. Thompson, C. G. Wilson, M. J. Bowden, ACS Symp. Ser., 219:87 (1983), American Chemical Society, Wash.]. Specifically, there is a strong demand for radiation sensitive compositions which are preferably sensitive to a wide region of spectrum and, hence, applicable to not only the conventional photolithography but also advanced lithographic techniques, such as mid UV, deep UV, electron beam, or X-ray lithography, without sacrificing the sensitivity.

A chemically sensitized resist, which has been for the first time disclosed by Ito et al. [H. Ito and C. G. Wilson, Polym. Eng. Sci., Vol. 23, 1012 (1983)], has been extensively used for the production of a radiation sensitive composition having a high sensitivity to high energy radiation. In general, a single proton generated during irradiation is catalytically reacted at room temperature or a temperature above room temperature depending upon the chemical composition of the radiation sensitive composition. This catalytic reaction imparts a high sensitivity to the radiation sensitive composition.

In the semiconductor industry, there is a premise that a radiation sensitive composition (hereinafter often referred to as "resist mixture") should be developable with an alkaline solution. Preferably, the alkaline solution is an organic base solution, such as 2 to 3 wt % aqueous solution of tetramethylammonium hydroxide (TMAH).

A novolak resin or a homopolymer or a copolymer of vinylphenol is best suited for this purpose. For photolithography, the use of novolak is limited to the case where the radiation has a longer wavelength than 300 nm because novolak has a high absorption in shorter wavelengths. Adverse effect of absorbance causes the resist image to have such a profile that the wall is extremely inclined. The vinylphenolic resin can be used in deep UV lithography only when it has a combination of desired dissolution properties with high optical transparency. Poly(4-vinylphenol), when used alone, exhibits a considerably high dissolution rate and, therefore, as such, is not suitable for the above purpose. One of the methods for lowering the dissolution rate to a desired level is to copolymerize 4-vinylphenol with other alkyl-substituted vinylphenols. Such copolymers are described in European Patent Nos. 0307752 and 0307751 and Japanese Patent Laid-Open No. 166105/1990. Other copolymers of 4-hydroxystyrene are described, independently of the solubility thereof in an aqueous alkaline solution, by Maruzen Petrochemical Co., Ltd. in "Kobunshi," Vol. 38, 571 (1989).

Basically, alkali-soluble poly(4-vinylphenol) and copolymers thereof may be used as a radiation sensitive composition by two methods. One of the methods is to add a protective group, clearable with an acid, to hydroxyl groups in such a manner that the protective group is added to all the hydroxyl groups to render the polymer insoluble or alternatively to part of the hydroxyl groups. A mixture of such a protected polymer with a photo-acid generator, which will be described later, is prepared. This mixture, when irradiated with actinic radiation, generates an acid which withdraws the protective group sensitive to an acid. The protective group include tert-butyloxycarbonyloxy or its derivatives (Ito et al., J. Photopolym. Sci. & Tech., Vol. 6, No. 4, 1993, p. 547) and a tetrahydropyranyl group (Hattori et al., J. Photopolym. Sci. & Tech., Vol. 6, No. 4, 1993, p. 497). Another method is to mix the alkali-soluble poly(4-vinylphenol) or copolymers thereof with a dissolution inhibitor sensitive to an acid, such as polyacetals described by Pawlowski et al., J. Photopolym. Sci. & Tech., Vol. 15, No. 1 (1992) p. 55. This mixture is insoluble in an aqueous alkaline developer before exposure. The exposure thereof to deep UV light, however, brings about cleavage of the dissolution inhibitor compound, rendering the mixture soluble in the alkaline developer.

Compounds capable of generating a strong acid upon exposure to actinic radiation, called "acid generator," for example, photo diazonium salt, a phosphonium salt, a sulfonium salt, and an iodonium salt of non-nucleophilic acids, such as $HSbF_6$ and $HAsF_6$, have hitherto been used as described in J. V. Crivello, Polym. Eng. Sci., 23 (1983) 953. Further, halogen compounds, particularly trichloromethyltriazine derivatives or trichloromethyloxadiazole derivatives, o-quinonediazide sulfonylchloride, o-quinonediazide-4-sulfonate, a combination of an organometal/an organohalogen, bis-(sulfonyl) diazomethane, sulfonylcarbonyldiazomethane (DE-A 3,930,087), and nitrobenzyl tosylate are recommended by F. M. Houlihan et al., SPIE Proc., Adv. in Resist Tech. and Proc. 920 (1988) 67.

In principle, mixing of a matrix resin soluble in an aqueous alkali, a dissolution inhibitor (which is unnecessary when a poly(hydroxystyrene) resin, of which the phenolic group is protected by a protective group sensitive to an acid, is used), and a light acid generator together in a conventional solvent suffices for the production of a chemical sensitization photoresist. Such a system, however, is unstable due to a very high sensitivity of a latent acid image and provides a small line width, resulting in the formation of T-top. This problem is significant when a delay occurs between the exposure step and the processing steps after exposure. It is extensively discussed in published literatures, for example, "Airborne Chemical Contamination of a Chemically Amplified Resist", S. A. MacDonald, "Advances in Resist Technology and Processing", edited by Hiroshi Ito, Proc. SPIE 1466, 2–12(1991). Different studies by L. Schlegel et al. show a problem of diffusion in chemically sensitized resist materials (L. Schlegel, Japanese Journal of Applied Physics, series 5, 1991, pp. 175–180).

In order to avoid the above problem, an additive, such as a photo base or photosensitive base material, can be added to the conventional compound, thereby enhancing the contrast and inhibiting the reduction in line width (Japanese Patent Laid-Open No. 25753/1993 (filing date: Feb. 15, 1993)). This radiation sensitive composition is not always satisfactory in focus latitude (depth of focus).

An object of the present invention is to provide a radiation sensitive composition which has a large focus latitude (depth of focus), is highly transparent to deep UV, KrF exima laser beam and the like and highly sensitive to these light sources, electron beams, and X-rays, has excellent heat resistance and markedly excellent adhesion to the substrate, and can provide a high precision pattern causing no dimensional change in pattern with time.

SUMMARY OF THE INVENTION

According to one aspect of the present invention, there is provided a radiation sensitive composition comprising:
a) a binder insoluble in water and soluble in an aqueous alkali solution or swellable in an aqueous alkali solution,
b) an insolubilizer comprising poly(N,O-acetal) represented by the general formula (I):

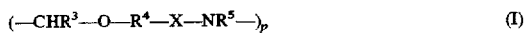

$(-CHR^3-O-R^4-X-NR^5-)_p$ (I)

where $R^3$ is an alkyl, aryl, or substituted aryl group,
$R^4$ is a divalent alkylene, cycloalkylene, alkene, or divalent alkyne group,
$R^5$ is an alkyl, alkene, alkyne, or cycloalkyl group,
X is —OCO—, —CO—, or —NHCO—, and
p is an integer of 1 or more,
and/or☐a phenolic compound having a hydroxyl group protected with a group cleavable by an acid,
c) a photosensitive compound capable of generating an acid upon exposure to actinic radiation,
d) a base capable of degrading into a neutral compound upon exposure to actinic radiation,
e) a phenolic compound represented by the general formula (II):

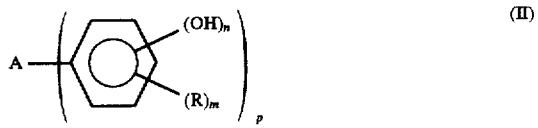

where n is an integer of 1 to 5, m is an integer of 0 to 4, n+m≦5, and p is an integer of 1 to 10,
each R is a $C_1$–$C_{12}$ alkyl group or an unsubstituted or substituted cycloalkyl group or a $C_1$ –$C_5$ hydroxyalkyl group, provided that hydrogen atoms may be substituted with a halogen atom and, when m is not less than 2, each R may be the same or different; A represents a hydrocarbon atomic grouping, having a valence of p, including an unsubstituted or substituted $C_1$–$C_{100}$ alicyclic, chain aliphatic, or aromatic hydrocarbon or a combination thereof with the carbon atoms being optionally substituted with an oxygen atom, provided that when p is 1, A may represent a hydrogen atom and, when p is 2, A may represent —S—, —SO—, —SO$_2$—, —O—, —CO—, or a direct bond, and
f) a solvent.

According to another aspect of the present invention, there is provided a method for forming a pattern, comprising the steps of: exposing a film selectively to actinic radiation; heating the film; and developing the exposed film to remove the exposed area for a positive radiation sensitive composition or the nonexposed area for a negative radiation sensitive composition. In the case of the negative radiation sensitive composition, a crosslinking agent is used instead of the component (b). Examples of the crosslinking agent include hexamethoxymethylmelamine and benzyl alcohol derivatives of hexahydroxymelamine.

An object of the present invention is to provide a novel radiation sensitive composition which is highly sensitive to radiation, has good adhesion to the substrate, large latitude in processing, and is developable with an aqueous alkali solution commonly used in the production of semiconductors.

Polymers having phenol groups, derivatives of polyacrylic acid, derivatives of polymethacrylic acid, and polyvinyl alcohol may be used as the component a). Among them, the polymer having phenol groups is preferred. The hydroxyl groups in the phenol group may be partly or entirely protected with a group cleavable by an acid. Preferred examples of the protective group include t-butyloxycarbonyl, ethoxyethyl, tetrahydropyranyl, and trialkylsilyl groups.

A representative example of the component a) is a homopolymer or a copolymer of 4-hydroxystyrene. The comonomer may be a generally available monomer such as styrene or an acrylic ester, and examples thereof include styrene and alkyl derivatives thereof, such as 3-methyl-4-hydroxystyrene, tetrahydropyranyloxystyrene, and t-butoxycarbonyloxy-styrene. Preferred are poly(hydroxystyrene), poly(4-hydroxystyrene-co-3-methyl-4-hydroxystyrene), and poly(4-hydroxystyrene-co-styrene). Still preferably, the comonomer has a styrene content of 2 to 50%.

The component (b) may be a monomer or a polymer which is degradable with an acid in a low concentration at room temperature or a high temperature. This compound should serve as a dissolution inhibitor component a) in an aqueous alkali solution. The poly(N,O-acetal), as the component b), represented by the general formula I may be produced by transesterifying dimethylacetal of a urethane-alcohol component and an aldehyde in the presence of an acid catalyst. The degree of condensation and the molecular weight distribution can be regulated by varying polycondensation conditions. The group, as a protective group for the phenolic compound in the component b), which is cleavable with an acid is preferably t-butyloxycarbonyl, ethoxytetrahydropyranyl, or a trialkylsilyl group. Examples of the phenolic compound include poly(hydroxystyrene), poly(4-hydroxystyrene-co-3-methyl-4-hydroxystyrene), and poly(4-hydroxystyrene-co-styrene).

It is also possible to incorporate, into a single compound, the functions of the components a) and b), that is, the dissolution in an alkali, film formation, and thermal stability as the function of the component a) and the capability of preventing the dissolution in an alkali as the function of (phenolic resin) of the component (b). This can be achieved by covalently bonding a group sensitive to an acid, such as a tetrahydropyranyl group or a t-butoxycarbonyloxy group, to a hydroxyl group of phenol. That is, when the component (a) is a polymer having phenol groups with hydroxyl groups satisfactorily protected by a group cleavable with an acid, there is no need to add the component b). The proportion of the amount of the protected OH group to the total amount of the OH group present in the components a) and b) is 0 to 60 mol %.

The component c) may be any compound capable of generating an acid upon exposure to actinic radiation. Suitable examples of the acid generating compound include diazomethane compounds, iodonium salts, sulfonium salts, halides, and o-quinonediazidosulfonic esters. The component c) is preferably a compound represented by the general formula (III):

Ar—SO$_2$—C(N$_2$)—Y—Ar' (III)

where Ar and Ar' independently represent a phenyl, chlorophenyl, tolyl, or alkyl group or a combination thereof, Y represents —SO$_2$— or —CO—, or the formula:

$(Ar)_3S^+R_6SO_3^-$ where Ar represents a phenyl group and $R_6$ is an alkyl or alkyl halide group. Preferably, the compound can generate a sulfonic acid, has good thermal stability, and can exhibit advantageous absorption characteristics preferably in a region of 220 to 380 nm, particularly preferably in a region of 220 to 248 nm. Phenolic sulfonic ester, bis-sulfonylmethane, or bis-sulfonyldiazomethane is important.

Sulfonium sulfonates, such as triarylsulfonium sulfonate, bis-(4-chlorophenylsulfonyl)diazomethane, and camphorsulfonium sulfonate, are particularly preferred. Examples of the sulfonium sulfonate include triphenylsulfonium salt of alkylsulfonic acid, triphenylsulfonium salt of alkyl- or halogen-substituted arylsulfonic acid, and triphenylsulfonium salt of fluoroalkylsulfonic acid.

The component d) is a photosensitive base. It is preferably an onium salt having an acetate anion, a sulfonium ion, or ammonium ion. Particularly preferred compounds as the component d) are alkylammonium hydroxides or triaryl sulfonium and derivatives thereof or diphenyl iodonium hydroxide and derivatives thereof. The amount of the component d) varies depending upon the absorption characteristics of the base and the amount of the photo acid generator.

The component (e) is a phenolic compound represented by the general formula (II).

In the formula (II), n is preferably 1 to 2. R is preferably an alkyl group, such as a methyl or ethyl group, a cycloalkyl group, such as a cyclohexyl group, or a hydroxyalkyl group. The hydrogen atoms may be substituted with a halogen atom such as F or Cl. P is preferably 2 to 6. Preferred examples of A are as follows.

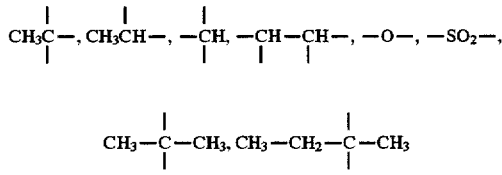

This type of compounds serve to improve the adhesion of the resist and enhance the contrast, thereby improving the resolution and depth of focus. Examples of the compound (e) include, but not limited to, the following compounds:
1) 4,4'-dihydroxybiphenyl;
2) 4,4'-methylenebisphenol;
3) 2,4'-methylenebisphenol;
4) 2,2'-methylenebisphenol;
5) 1,1-bis(4-hydroxyphenyl)ethane;
6) bis(4-hydroxy-3,5-dimethylphenyl)methane;
7) 1,1,1-tris(4-hydroxyphenyl)ethane;
8) 2,2-bis(3-methyl-4-hydroxyphenyl)propane;
9) 1,1-bis(4-hydroxyphenyl)cyclohexane;
10) 2,2-(4-hydroxyphenyl)-4-methyl-pentane;
11) 2,2-bis(4-hydroxy-3,5-dimethylphenyl)propane;
12) 4,4'-(1-phenylethylidene)bisphenol;
13) 4,4'-(2-ethylhexylidene)bisphenol;
14) 2,2-bis(3-phenyl-4-hydroxyphenyl)propane;
15) tris(4-hydroxyphenyl)methane;
16) 1,1-bis(4-hydroxyphenyl)-1-{4-[1-(4-hydroxyphenyl)1-(methyl)ethylidene]}ethane;
17) 3,3'-bis(4-hydroxyphenyl)butane;
18) 4,4'-(2-methylpropylidene)bisphenol;
19) 4,4'-(phenylmethylene)bisphenol;
20) 4,4'-(1-methylheptylidene)bisphenol;
21) 4,4'-cychlohexylidenebis(3-methylphenol);
22) 4,4'-(9H-fluoren-9-ylidene)bisphenol;
23) 4,4'-[1,4-phenylenebis(1-methylethylidene)]bis(2methylphenol);
24) 1,1,1-tris(3-methyl-4-hydroxyphenyl)ethane;
25) bis(3,5-dimethyl-4-hydroxyphenyl)-3,4dihydroxyphenylmethane;
26) 2-hydroxy-5-methyl-1,3-xylenediol;
27) 4,4'-bicyclohexyldiol;
28) 4,4'-cyclopentylidenebisphenol;
29) 4,4'-(1-phenylethylidene)bis[2-methylphenol];
30) 4,4'-(diphenylmethylene)bisphenol;
31) 3,3'4,4'-[1,4-phenylenebis(1methylethylidene)]bisbenzenediol;
32) 1,1-di(3-methyl, 4-hydroxyphenyl)-2,2-di(3-methyl-4hydroxyphenyl)ethane;
33) 1,1-di(3,5-dimethyl-4-hydroxyphenyl)-2,2-di(3,5dimethyl, 4-hydroxyphenyl)ethane;
34) 4,4'-bis(4-hydroxyphenyl)pentanoic acid;
35) 2,2-bis(4-hydroxyphenyl)hexafluoropropane;
36) 4,4'-dihydroxybenzophenone;
37) 3,3',5,5'-tetramethyl-4,4'-dihydroxybiphenyl;
38) 3,3'-dimethyl-4,4'-dihydroxybiphenyl;
39) 3,3',5,5'-tetrafluoro-4,4'-dihydroxybiphenyl;
40) 3,3'-difluoro-4,4'-dihydroxybiphenyl;
41) bis(4-hydroxyphenyl)dimethylsilane;
42) bis(3,5-dimethyl-4-hydroxyhexyl)methane; and
43) bis(4-hydroxyhexyl)methane; and the like.

Besides the compounds represented by the formula II, a low-molecular weight (Mw=up to 5,000 (standard polystyrene) homopolymer or copolymer of 4-hydroxystyrene may be used as the component e).

The total solid content of the composition is 10 to 50% by weight, preferably 15 to 25%. The term "solid" used herein is intended to mean the components a) to e). The a) to b) weight ratio may be 100:0 to 50:50 depending upon the molecular weight and chemical properties of the components a) and b) and the solubility of the compound a) in the aqueous alkali developer. When this radiation sensitive composition is used for pattern formation purposes, a uniform film can be formed on a substrate wafer such as silicon.

The a) to b) weight ratio may be preferably determined by the rate of dissolution of the component a) in an aqueous alkali solution. The particularly preferable a) to b) weight ratio is 80:20 to 60:40.

The amount of the component c) is 0.2 to 5% by weight, preferably 1 to 3% by weight, based on the total amount of the components a) and b). The absorption characteristics of the component c) are an important factor in determining the amount of the component c). The necessary amount of the component d) is determined by determining the amount of the component c). The amount of the component e) is 0.1 to 20% by weight, preferably 1 to 10% by weight. The absorption characteristics of the component e) are important, and compounds which exhibit low absorption at wavelengths used in irradiation are preferred.

It is a matter of course that a resist can be produced by simply mixing the components a) to d) together in a conventional solvent. The addition of the component e), however, can improve the resolution and depth of focus of the composition.

The component (f) is not particularly limited so far as it is a solvent that can dissolve the components a) to e). Propylene glycol monomethyl ether acetate (PGMEA), ethyl lactate (EL) cellosolve acetate and the like are preferred from the viewpoints of safety, solubility, boiling point, film formability and the like.

In the present invention, each of the components a) to f) may be either a single component type or a multicomponent type.

The formation of a pattern using the resist material of the present invention can be carried out, for example, by the following method.

The resist material of the present invention is coated on a substrate, such as a silicon wafer, to a thickness of 500 to 2000 nm. The resultant coating is baked by heating the coated substrate in an oven at 60° to 150° C. for 10 to 30 min or alternatively on a hot plate at 60° to 150° C. for 1 to 2 min. A mask for forming a desired pattern is provided on the resist film thus obtained, and, in this state, the resist film is then exposed to deep UV light having a wavelength of 300 nm or less at a dose of about 1 to 100 mJ/cm$^2$ and developed for 0.5 to 3 min using a developing solution, such as a 0.1 to 5% aqueous solution of tetramethylammonium hydroxide (TMAH), by immersion, spraying, paddling, or other conventional methods, thereby forming a desired pattern on the substrate.

EXAMPLES

The present invention will now be described in more detail with reference to the following examples. In the following examples, all "%" are by weight unless otherwise specified.

Preparation Example 1 [Synthesis of poly(N,O-acetal)]

Synthesis of starting compound A:

102.09 g of 4-methyl-1,3-dioxolan-2-one was reacted with 59.11 g of propylamine while gradually adding the amine from a dropping funnel. The reaction mixture was sometimes cooled to keep the temperature at room temperature, 25° C. After the addition of the amine was completed, the reaction system was heated at 70° C. for 5 hr. Compound A thus obtained was purified by distillation. It had a boiling point of 114° to 115° C. at 0.4 Torr. The yield was 159.6 g (99%).

Compound A and benzaldehyde dimethyl acetal(molar ratio=1:1) were reacted with each other at 130° C. in the presence of an acid catalyst Amberlyst 15 using a xylene reaction medium. The formed water was removed as an azeotrope, and xylene was sometimes added. After the reaction for 8 hr, Amberlyst 15 was removed by filtration, and xylene was distilled off. The reaction mixture was further heated under reduced pressure (0.001 Torr), and low-molecular weight fractions were removed at 160° C. using a thin film evaporator.

Preparation Example 2

A resist composition was prepared according to the following formulation.

| | |
|---|---|
| Poly(4-hydroxystyrene-co-styrene) (Mw = 15,000) | 5.67 g |
| Polyacetal of Preparation Example 1 | 3.15 g |
| α,α-Bis(p-chlorophenyl)diazomethane | 0.18 g |
| 0.1 mmol/g solution of triphenylsulfonium acetate in propylene glycol monomethyl ether acetate (PGMEA) | 2.76 g |
| Propylene glycol monomethyl ether acetate (PGMEA) | 41 g |

The mixture was agitated for not shorter than 1 hr, and the resultant resist solution was filtered through 0.5 and 0.2-μm filters to remove particles. The resist solution thus obtained was spin-coated on a silicon wafer (any semiconductor base material being usable), and the resultant coating was prebaked at a temperature of 130° C. for 60 sec. The thickness of the resist was 0.746 μm. The coated silicon base material thus obtained was selectively exposed to KrF excimer laser at 248.4 nm using a mask and a stepper having a number of aperture of 0.5. The exposed, coated silicon base material was baked on a hot plate at 55° C. for 155 sec and developed with an alkaline developer (2.38 wt % tetramethylammonium hydroxide) for 60 sec, thereby dissolving and removing the exposed area alone of the resist material. Thus, a positive pattern was obtained. The positive pattern had an aspect ratio of about 90° K, the resolution for lines and spaces was 0.24 μm, the exposure energy was 32.1 mJ/cm$^2$, and the depth of focus was 0.9 μm in lines and spaces of 0.3 μm.

Preparation Example 3

The procedure of Preparation Example 2 was repeated to prepare a resist composition according to the following formulation, and the same experiment as described in Production Example 2 was carried out.

| | |
|---|---|
| Poly(4-hydroxystyrene-co-3-methyl-4-hydroxystyrene) (Mw = 10000, 4-hydroxystyrene content = 60 mol %) | 5.67 g |
| Polyacetal of Preparation Example 1 | 3.15 g |
| α,α-Bis(p-chlorophenyl)diazomethane | 0.136 g |
| 0.1 mmol/g solution of triphenylsulfonium acetate in PGMEA | 2.09 g |
| PGMEA solvent | 41 g |

The positive pattern had an aspect ratio of about 90° K, the resolution for lines and spaces was 0.24 μm, the exposure energy was 52 mJ/cm$^2$, and the depth of focus was 0.9 μm in lines and spaces of 0.3 μm.

Preparation Example 4

The procedure of Preparation Example 2 was repeated to prepare a resist composition according to the following formulation, and the same experiment as described in Preparation Example 2 was carried out.

| | |
|---|---|
| Poly(4-hydroxystyrene-co-3-methyl-4-hydroxystyrene) (Mw = 15000, 4-hydroxystyrene content = 65 mol %) | 6.3 g |
| Polyacetal of Preparation Example 1 | 2.7 g |
| α,α-Bis(p-chlorophenyl)diazomethane | 0.205 g |
| 0.1 mmol/g solution of triphenylsulfonium acetate in PGMEA | 4.05 g |
| PGMEA solvent | 41 g |

The positive pattern had an aspect ratio of about 90° K, the resolution for lines and spaces was 0.24 μm, the exposure energy was 52 mJ/cm$^2$, and the depth of focus was 0.9 μm in lines and spaces of 0.3 μm.

Preparation Example 5

The procedure of Preparation Example 2 was repeated to prepare a resist composition according to the following formulation, and the same experiment as described in Preparation Example 2 was carried out.

| | |
|---|---|
| Poly(4-hydroxystyrene-co-3-methyl-4-hydroxystyrene) (Mw = 10000, 4-hydroxystyrene content = 60 mol %) | 6.3 g |
| Polyacetal of Preparation Example 1 | 2.7 g |
| Triphenylsulfonium hexafluoropropylsulfonate | 0.205 g |
| 0.1 mmol/g solution of triphenylsulfonium acetate in PGMEA | 4.05 g |
| PGMEA solvent | 41 g |

9

The positive pattern had an aspect ratio of about 90° K, the resolution for lines and spaces was 0.24 µm, the exposure energy was 52 mJ/cm$^2$, and the depth of focus was 0.9 µm in lines and spaces of 0.3 µm.

Example 1

A resist composition was prepared according to the following formulation.

| | |
|---|---|
| Poly(4-hydroxystyrene-co-styrene) (Mw = 15,000, styrene content = 5 mol %) | 5.67 g |
| Polyacetal of Preparation Example 1 | 3.15 g |
| α,α-Bis(p-chlorophenyl)diazomethane | 0.18 g |
| 0.1 mmol/g solution of triphenylsulfonium acetate in propylene glycol monomethyl ether acetate (PGMEA) | 2.76 g |
| 2,2-Bis(4-hydroxyphenyl)propane(bisphenol A) | 0.18 g |
| Propylene glycol monomethyl ether acetate (PGMEA) | 40 g |

The mixture was agitated for not shorter than 1 hr, and the resultant resist solution was filtered through 0.5 and 0.2-µm filters to remove particles. The resist solution thus obtained was spin-coated on a silicon wafer (any semiconductor base material being usable), and the resultant coating was prebaked at a temperature of 130° C. for 60 sec. The thickness of the resist was 0.746 µm. The coated silicon base material thus obtained was selectively exposed to KrF excimer laser at 248.4 nm using a mask and a stepper having a number of aperture of 0.45. The exposed, coated silicon base material was baked on a hot plate at 55° C. for 155 sec and developed with an alkaline developer (2.38 wt % tetramethylammonium hydroxide) for 60 sec, thereby dissolving and removing the exposed area alone of the resist material. Thus, a positive pattern was obtained. The positive pattern had a wall angle of about 90° K, the ultimate resolution for lines and spaces was 0.22 µm, and the depth of focus was 1.5 µm at 0.3 µm lines and spaces.

Example 2

The procedure of Example 1 was repeated to prepare a resist composition according to the following formulation, and the same experiment as described in Example 1 was carried out.

| | |
|---|---|
| Poly(4-hydroxystyrene-co-3-methyl-4-hydroxystyrene) (Mw = 10000, 4-hydroxystyrene content = 60 mol %) | 5.67 g |
| Polyacetal of Preparation Example 1 | 3.15 g |
| α,α-Bis(p-chlorophenyl)diazomethane | 0.136 g |
| 0.1 mmol/g solution of triphenylsulfonium acetate in PGMEA | 2.09 g |
| 2,2-Bis(4-hydroxyphenyl)propane | 0.18 g |
| PGMEA solvent | 41 g |

The positive pattern had a wall angle of 90° K, the ultimate resolution for lines and spaces was 0.20 µm, and the depth of focus was 1.7 µm at 0.3 µm lines and spaces.

Example 3

The procedure of Example 1 was repeated to prepare a resist composition according to the following formulation, and the same experiment as described in Example 1 was carried out.

| | |
|---|---|
| Poly(4-hydroxystyrene-co-3-methyl-4-hydroxystyrene) (Mw = 15000, 4-hydroxystyrene content = 65 mol %) | 6.12 g |
| Polyacetal of Preparation Example 1 | 2.7 g |
| α,α-Bis(t-butylphenyl)diazomethane | 0.18 g |
| 0.1 mmol/g solution of triphenylsulfonium acetate in PGMEA | 2.76 g |
| 1,1,1-Tris(4-hydroxyphenyl)ethane | 0.18 g |
| PGMEA | 41 g |

The positive pattern had an aspect ratio of about 90° K, the ultimate resolution for lines and spaces was 0.20 µm, and the depth of focus was 1.7 µm at 0.3 µm lines and spaces.

Example 4

The procedure of Example 1 was repeated to prepare a resist composition according to the following formulation, and the same experiment as described in Example 1 was carried out.

| | |
|---|---|
| Poly(4-hydroxystyrene-co-3-methyl-4-hydroxystyrene) (Mw = 15000, 4-hydroxystyrene content = 65 mol %) | 6.12 g |
| Polyacetal of Preparation Example 1 | 2.7 g |
| Triphenylsulfonium hexafluoropropylsulfonate | 0.2 g |
| 0.1 mmol/g solution of triphenylsulfonium acetate in PGMEA | 4 g |
| 1,1,1-Tris(4-hydroxyphenyl)ethane | 0.18 g |
| PGMEA | 41 g |

The positive pattern had an aspect ratio of about 90° K, the resolution for lines and spaces was 0.20 µm, and the depth of focus was 1.7 µm at 0.3 µm lines and spaces.

Example 5

The procedure of Example 1 was repeated to prepare a resist composition according to the following formulation, and the same experiment as described in Example 1 was carried out.

| | |
|---|---|
| Poly(4-hydroxystyrene-co-3-methyl-4-hydroxystyrene) (Mw = 15000, 4-hydroxystyrene content = 65 mol %) | 5.94 g |
| Polyacetal of Preparation Example 1 | 2.7 g |
| Triphenylsulfonium hexafluoropropylsulfonate | 0.2 g |
| 0.1 mmol/g solution of triphenylsulfonium acetate in PGMEA | 4 g |
| 1,1,1-Tris(4-hydroxyphenyl)ethane | 0.36 g |
| PGMEA | 41 g |

The positive pattern had an aspect ratio of about 90° K, the resolution for lines and spaces was 0.20 µm, and the depth of focus was 1.7 µm at 0.3 µm lines and spaces.

Example 6

The procedure of Example 1 was repeated to prepare a resist composition according to the following formulation, and the same experiment as described in Example 1 was carried out.

| | |
|---|---|
| Poly(4-hydroxystyrene-co-3-methyl-4-hydroxystyrene) (Mw = 15000, 4-hydroxystyrene content = 65 mol %) | 5.94 g |
| Polyacetal of Preparation Example 1 | 2.7 g |
| Triphenylsulfonium hexafluoropropylsulfonate | 0.2 g |
| 1,1-Bis(4-hydroxyphenyl)-1-{4-[1-(4-hydroxyphenyl)1-(methyl)ethylidene]ethane | 0.18 g |
| 0.1 mmol/g solution of triphenylsulfonium | 4 g |

-continued

| | |
|---|---|
| acetate in PGMEA | |
| PGMEA | 41 g |

The positive pattern had an aspect ratio of about 90° K, the resolution for lines and spaces was 0.20 μm, and the depth of focus was 1.7 μm at 0.3 μm lines and spaces.

Example 7

The procedure of Example 1 was repeated to prepare a resist composition according to the following formulation, and the same experiment as described in Example 1 was carried out.

| | |
|---|---|
| Poly(4-hydroxystyrene-co-3-methyl-4-hydroxystyrene) (Mw = 15000, 4-hydroxystyrene content = 65 mol %) | 5.67 g |
| Polyacetal of Preparation Example 1 | 3.15 g |
| α,α-Bis(p-chlorophenyl)diazomethane | 0.18 g |
| 0.1 mmol/g solution of triphenylsulfonium acetate in PGMEA | 2.76 g |
| 2,2-Bis(4-hydroxyphenyl)hexafluoropropane (bisphenol AF) | 0.18 g |
| Propylene glycol monomethyl ether acetate (PGMEA) | 40 g |

The positive pattern had an aspect ratio of about 90° K, the resolution for lines and spaces was 0.20 μm, and the depth of focus was 1.7 μm at 0.3 μm lines and spaces.

Example 8

The procedure of Example 1 was repeated to prepare a resist composition according to the following formulation, and the same experiment as described in Example 1 was carried out.

| | |
|---|---|
| Poly(4-hydroxystyrene-co-styrene) (Mw = 15000, styrene content = 5 mol %) | 6.12 g |
| Polyacetal of Production Example 1 | 2.7 g |
| α,α-Bis(p-chlorophenyl)diazomethane | 0.18 g |
| 0.1 mmol/g solution of triphenylsulfonium acetate in PGMEA | 2.76 g |
| 2,2-Bis(4-hydroxyphenyl)hexafluoropropane (bisphenol AF) | 0.18 g |
| Propylene glycol monomethyl ether acetate (PGMEA) | 40 g |

The positive pattern had an aspect ratio of about 90° K, the resolution for lines and spaces was 0.20 μm, and the depth of focus was 1.7 μm at 0.3 μm lines and spaces.

Example 9

The procedure of Example 1 was repeated to prepare a resist composition according to the following formulation, and the same experiment as described in Example 1 was carried out.

| | |
|---|---|
| Poly(4-hydroxystyrene-co-3-methyl-4-hydroxystyrene) (Mw = 15000, 4-hydroxystyrene content = 65 mol %) | 6.12 g |
| Polyacetal of Preparation Example 1 | 2.7 g |
| α,α-Bis(p-chlorophenyl)diazomethane | 0.18 g |
| 0.1 mmol/g solution of triphenylsulfonium acetate in PGMEA | 2.76 g |
| 1,1-Bis(4-hydroxyphenyl)-1-phenylethane | 0.18 g |
| Propylene glycol monomethyl ether acetate (PGMEA) | 40 g |

The positive pattern had an aspect ratio of about 90° K, the resolution for lines and spaces was 0.20 μm, and the depth of focus was 1.5 μm at 0.3 μm lines and spaces.

Example 10

The procedure of Example 1 was repeated to prepare a resist composition according to the following formulation, and the same experiment as described in Example 1 was carried out.

| | |
|---|---|
| Poly(4-hydroxystyrene) | 6.12 g |
| Polyacetal of Preparation Example 1 | 2.7 g |
| α,α-Bis(p-chlorophenyl)diazomethane | 0.18 g |
| 0.1 mmol/g solution of triphenylsulfonium acetate in PGMEA | 2.76 g |
| 1,1,1-Tris(4-hydroxyphenyl)ethane | 0.18 g |
| Propylene glycol monomethyl ether acetate (PGMEA) | 40 g |

The positive pattern had an aspect ratio of about 90° K, the resolution for lines and spaces was 0.20 μm, and the depth of focus was 1.5 μm at 0.3 μm lines and spaces.

Example 11

The procedure of Example 1 was repeated to prepare a resist composition according to the following formulation, and the same experiment as described in Example 1 was carried out.

| | |
|---|---|
| Poly(4-hydroxystyrene-co-t-butyloxycarbonyloxystyrene) (Mw = 14000, 4-hydroxystyrene content = 90 mol %) | 6.12 g |
| Polyacetal of Preparation Example 1 | 2.0 g |
| α,α-Bis(p-chlorophenyl)diazomethane | 0.18 g |
| 0.1 mmol/g solution of triphenylsulfonium acetate in PGMEA | 2.76 g |
| 1,1,1-Tris(4-hydroxyphenyl)ethane | 0.18 g |
| Propylene glycol monomethyl ether acetate (PGMEA) | 40 g |

The positive pattern had an aspect ratio of about 90° K, the resolution for lines and spaces was 0.20 μm and the depth of focus was 1.5 μm at 0.3 μm lines and spaces.

Example 12

The procedure of Example 1 was repeated to prepare a resist composition according to the following formulation, and the same experiment as described in Example 1 was carried out.

| | |
|---|---|
| Poly(4-hydroxystyrene-co-tetrahydropyranyloxystyrene) (Mw = 14000, 4-hydroxystyrene content = 60 mol %) | 6.12 g |
| α,α-Bis(p-chlorophenyl)diazomethane | 0.18 g |
| 0.1 mmol/g solution of triphenylsulfonium acetate in PGMEA | 2.76 g |
| 1,1,1-Tris(4-hydroxyphenyl)ethane | 0.18 g |
| Propylene glycol monomethyl ether acetate (PGMEA) | 40 g |

The positive pattern had an aspect ratio of about 90° K, the resolution for lines and spaces was 0.20 μm and the depth of focus was 1.5 μm at 0.3 μm lines and spaces.

Example 13

The procedure of Example 1 was repeated to prepare a resist composition according to the following formulation, and the same experiment as described in Example 1 was carried out.

| | |
|---|---|
| Poly(4-hydroxystyrene-co-4-t-butoxycarbonyloxystyrene) (Mw = 14000, 4-hydroxystyrene content = 60 mol %) | 6.12 g |

-continued

| | |
|---|---|
| Triphenylsulfonium trifluoromethanesulfonate | 0.18 g |
| α,α-Bis(p-chlorophenyl)diazomethane | 0.18 g |
| 0.1 mmol/g solution of triphenylsulfonium acetate in PGMEA | 2.76 g |
| 1,1,1-Tris(4-hydroxyphenyl)ethane | 0.18 g |
| Propylene glycol monomethyl ether acetate (PGMEA) | 40 g |

The positive pattern had an aspect ratio of about 90° K, the resolution for lines and spaces was 0.20 µm, and the depth of focus was 1.5 µm at 0.3 µm lines and spaces.

Example 14

The procedure of Example 1 was repeated to prepare a resist composition according to the following formulation, and the same experiment as described in Example 1 was carried out.

| | |
|---|---|
| Poly(4-hydroxystyrene-co-tetrahydropyranyloxycarbonyloxy-styrene) (Mw = 14000, 4-hydroxystyrene content = 60 mol %) | 6.12 g |
| α,α-Bis(p-chlorophenyl)diazomethane | 0.18 g |
| 0.1 mmol/g solution of triphenylsulfonium acetate in PGMEA | 2.76 g |
| 1,1,1-Tris(4-hydroxyphenyl)ethane | 0.18 g |
| Propylene glycol monomethyl ether acetate (PGMEA) | 40 g |

The positive pattern had an aspect ratio of about °K, the resolution for lines and spaces was 0.20 µm, and the depth of focus was 1.5 µm at 0.3 µm lines and spaces.

Example 15

The procedure of Example 1 was repeated to prepare a resist composition according to the following formulation, and the same experiment as described in Example 1 was carried out.

| | |
|---|---|
| Poly(4-hydroxystyrene-co-3-methyl,4-hydroxystyrene) (Mw = 15000, 4-hydroxystyrene content = 65 mol %) | 6.12 g |
| Polyacetal of Preparation Example 1 | 2.7 g |
| α,α-Bis(p-chlorophenyl)diazomethane | 0.18 g |
| 0.1 mmol/g solution of triphenylsulfonium acetate in PGMEA | 2.76 g |
| 1,1-Bis(4-hydroxyphenyl)-1-{4-[1-(4-hydroxyphenyl)-1-(methyl)ethylidene]ethane | 0.18 g |
| PGMEA | 41 g |

The positive pattern had an aspect ratio of about 90° K, the resolution for lines and spaces was 0.20 µm, and the depth of focus was 1.7 µm at 0.3 µm lines and spaces.

Example 16

The procedure of Example 1 was repeated to prepare a resist composition according to the following formulation, and the same experiment as described in Example 1 was carried out.

| | |
|---|---|
| Poly(4-hydroxystyrene-co-3-methyl-4-hydroxystyrene) (Mw = 15000, 4-hydroxystyrene content = 65 mol %) | 6.12 g |
| Polyacetal of Preparation Example 1 | 2.7 g |
| α,α-Bis(t-butylphenyl)diazomethane | 0.18 g |
| 0.1 mmol/g solution of triphenylsulfonium acetate in PGMEA | 2.76 g |
| 2,2'-Bis(4-hydroxyphenyl)butane | 0.18 g |
| PGMEA | 41 g |

The positive pattern had an aspect ratio of about 90° K, the resolution for lines and spaces was 0.20 µm, and the depth of focus was 1.6 µm at 0.3 µm lines and spaces.

Example 17

The procedure of Example 1 was repeated to prepare a resist composition according to the following formulation, and the same experiment as described in Example 1 was carried out.

| | |
|---|---|
| Poly(4-hydroxystyrene-co-3-methyl-4-hydroxystyrene) (Mw = 15000, 4-hydroxystyrene content = 65 mol %) | 6.12 g |
| Polyacetal of Preparation Example 1 | 2.7 g |
| α,α-Bis(t-butylphenyl)diazomethane | 0.18 g |
| 0.1 mmol/g solution of triphenylsulfonium acetate in PGMEA | 2.76 g |
| 1,1-Bis(4-hydroxy-3-methylphenyl)cyclohexane | 0.18 g |
| PGMEA | 41 g |

The positive pattern had an aspect ratio of about 90° K, the resolution for lines and spaces was 0.20 µm, and the depth of focus was 1.5 µm at 0.3 µm lines and spaces.

Example 18

The procedure of Example 1 was repeated to prepare a resist composition according to the following formulation, and the same experiment as described in Example 1 was carried out.

| | |
|---|---|
| Poly(4-hydroxystyrene-co-3-methyl-4-hydroxystyrene) (Mw = 15000, 4-hydroxystyrene content = 65 mol %) | 6.12 g |
| 2,2-Bis(p-t-butoxycarbonyloxyphenyl)propane | 2.7 g |
| α,α-Bis(t-butylphenyl)diazomethane | 0.18 g |
| 0.1 mmol/g solution of triphenylsulfonium acetate in PGMEA | 2.76 g |
| 1,1-Bis(4-hydroxy,3-methylphenyl)cyclohexane | 0.18 g |
| PGMEA | 41 g |

The positive pattern had a wall angle of about 87° K, the resolution for lines and spaces was 0.24 µm, and the depth of focus was 1.4 µm at 0.3 µm lines and spaces.

Comparison of the results on the resolution and the depth of focus in Preparation Examples 2) to 5) and Examples 1) to 18) reveals that the use of the component e) of the present invention is important for improving the depth of focus and the resolution.

What is claimed is:

1. A radiation sensitive composition comprising in admixture:
   a) a binder insoluble in water and soluble in an aqueous alkali solution or swellable in an aqueous alkali solution,
   b) optionally a crosslinking agent or optionally a dissolution inhibitor comprising poly(N,O-acetal) represented by the general formula (I):
   (—CHR³—O—R⁴—X—NR⁵—) p 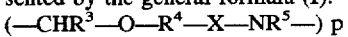
   where R³ is an alkyl, aryl, or substituted aryl group,
   R⁴ is a divalent alkylene, cycloalkylene, divalent alkene, or divalent alkyne group,
   R⁵ is an alkyl, alkene, alkyne, or cycloalkyl group,
   X is —OCO—, —CO—, or —NHCO—, and
   p is an integer of 1 or more, and/or a phenolic compound having a hydroxyl group protected with a group cleavable by an acid,
   c) a photosensitive compound capable of generating an acid upon exposure to actinic radiation,
   d) a base capable of degrading into a neutral compound upon exposure to actinic radiation, e) a phenolic compound in an amount effective to improve the resolution and depth of focus represented by the general formula (II):

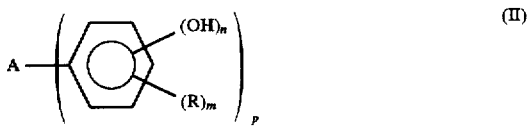

where n is an integer of 1 to 5, m is an integer of 0 to 4, n+m≦5, and p is an integer of 1 to 10, each R is a $C_1-C_{12}$ alkyl group or an unsubstituted or substituted cycloalkyl group or a $C_1-C_5$ hydroxyalkyl group, provided that hydrogen atoms may be substituted with a halogen atom and, when m is not less than 2, each R may be the same or different; A represents a hydrocarbon atomic grouping, having a valence of p, including an unsubstituted or substituted $C_1-C_{100}$ alicyclic, chain aliphatic, or aromatic hydrocarbon or a combination thereof with the carbon atoms being optionally substituted with an oxygen atom, provided that when p is 1, A may represent a hydrogen atom and, when p is 2, A may represent —S—, —SO—, —SO₂—, —O—, —CO—, or a direct bond, and f) a solvent.

2. The radiation sensitive composition as claimed in claim 1, wherein the component a) is a polymer having a phenol group with part of hydroxyl groups being optionally protected by a group cleavable with an acid.

3. The radiation sensitive composition as claimed in claim 2, wherein the component a) is poly(4-hydroxystyrene), poly(4-hydroxystyrene-co-3-methyl-4-hydroxystyrene), or poly(4-hydroxystyrene-co-styrene).

4. The radiation sensitive composition as claimed in claim 2, wherein the group cleavable with an acid is present in the component a) and is a t-butyloxycarbonyl, ethoxyethyl, tetrahydropyranyl, or trialkysilyl group.

5. The radiation sensitive composition as claimed in claim 1, wherein b) is present and the group cleavable with an acid is present in the component b) and is a t-butyloxycarbonyl, ethoxyethyl, tetrahydropyranyl, or trialkysilyl group.

6. The radiation sensitive composition as claimed in claim 1, wherein the component c) is represented by the formula (III):

where Ar and Ar' independently represent a phenyl, chlorophenyl, tolyl, or alkyl group or a combination thereof, Y represents —SO₂— or —CO—, or the formula:

where Ar represents a phenyl group and $R_6$ is an alkyl or alkyl halide group.

7. The radiation sensitive composition as claimed in claim 1, wherein the component c) generates a sulfonic acid upon exposure to actinic radiation.

8. The radiation sensitive composition as claimed in claim 1, wherein the base component d) is an onium salt having an acetate anion, a sulfonium ion, or an ammonium salt.

9. The radiation sensitive composition as claimed in claim 1, wherein the content of the component e) in the composition is 0.1 to 10% by weight based on the total amount of the solid.

10. The radiation sensitive composition as claimed in claim 4, wherein b) is present and the group cleavable with an acid is present in the component b) and is a t-butyloxycarbonyl, ethoxyethyl, tetrahydropyranyl, or trialkylsilyl group.

11. The radiation sensitive composition as claimed in claim 1, which has a weight ratio of a) to b) of 100:0 to 50:50; which comprises 0.2 to 5% by weight of c) based on the total amount of a) and b); and 0.1 to 20% by weight of e).

12. A material comprising a base and a layer of a radiation sensitive composition as claimed in claim 1 on the base.

13. A method of forming a pattern, comprising selectively exposing to actinic radiation a film formed from a radiation sensitive composition as claimed in claim 1, heating the film, and developing the exposed film.

14. A method as claimed in claim 13, wherein the radiation sensitive composition is a positive radiation sensitive composition and the developing comprises removing the exposed area.

15. A method as claimed in claim 13, wherein the radiation sensitive composition is a negative radiation sensitive composition and the developing comprises removing the non-exposed areas.

16. The radiation sensitive composition as claimed in claim 1, wherein b) is present and comprises a crosslinking agent, such that the composition is a negative radiation sensitive composition.

17. The radiation sensitive composition as claimed in claim 1, wherein b) is present and comprises a dissolution inhibitor, such that the composition is a positive radiation sensitive composition.

18. The radiation sensitive composition as claimed in claim 1, wherein c) comprises a sulfonium sulfonate.

19. A method as claimed in claim 13, that comprises coating the composition on a substrate to a thickness of 500 to 2000 nm, baking the coating by heating at 60° to 150° C. to form a film, providing a mask for forming a desired pattern on the film, exposing the film to deep UV light having a wavelength of 300 nm or less at a dose of about 1 to 100 mJ/cm², and developing the exposed film for 0.5 to 3 minutes using developing solution, thereby forming a desired pattern on the substrate.

* * * * *